(12) United States Patent
Willshere

(10) Patent No.: US 8,985,014 B2
(45) Date of Patent: Mar. 24, 2015

(54) PRINT HEAD ASSEMBLY, SCREEN PRINTING SYSTEM AND METHOD

(75) Inventor: Jeffrey Richard Willshere, Dorset (GB)

(73) Assignee: DTG International GmbH, Zuerich (CH)

( * ) Notice: Subject to any disclaimer, the term of this patent is extended or adjusted under 35 U.S.C. 154(b) by 1137 days.

(21) Appl. No.: 12/922,271

(22) PCT Filed: Mar. 13, 2009

(86) PCT No.: PCT/GB2009/000677
§ 371 (c)(1),
(2), (4) Date: May 12, 2011

(87) PCT Pub. No.: WO2009/112841
PCT Pub. Date: Sep. 17, 2009

(65) Prior Publication Data
US 2011/0219966 A1      Sep. 15, 2011

(30) Foreign Application Priority Data

Mar. 13, 2008 (GB) .................... 0804732.6

(51) Int. Cl.
*B41F 15/46* (2006.01)
*B41F 15/44* (2006.01)
*B41M 1/12* (2006.01)
*B41F 15/42* (2006.01)
*H05K 3/12* (2006.01)

(52) U.S. Cl.
CPC ............... *B41F 15/423* (2013.01); *B41M 1/12* (2013.01); *H05K 3/1233* (2013.01)
USPC ............................ 101/123; 101/114; 101/129

(58) Field of Classification Search
CPC ........ B41F 15/423; B41F 15/44; B41F 15/46; B41F 15/08; B41F 15/0813; B41F 15/0818; B41F 15/0845; B41F 15/085; B41F 15/42; B41M 1/12; H05K 3/1233; B41P 2200/40; B41P 2215/00; B41P 2215/132
USPC .......................................... 101/114, 123, 129
IPC ............................................. B41F 15/44, 15/46
See application file for complete search history.

(56) References Cited

U.S. PATENT DOCUMENTS 4,063,502 A * 12/1977 Cunningham ................ 101/123
4,586,433 A    5/1986 Jaffa et al.

(Continued)

FOREIGN PATENT DOCUMENTS

| EP | 0 806 295 | 11/1997 |
|----|-----------|---------|
| WO | 97/08655 | 3/1997 |
| WO | 2006/100116 | 9/2006 |

OTHER PUBLICATIONS

International Search Report for corresponding application No. PCT/GB2009/000677 dated Jun. 4, 2009.

*Primary Examiner* — Leslie J Evanisko
(74) *Attorney, Agent, or Firm* — Renner, Otto, Boisselle & Sklar, LLP

(57) ABSTRACT

A print head assembly (119) for printing a print medium (PM) onto a workpiece (W) through a printing screen (105) which includes a screen element having a pattern of printing apertures therein, the assembly comprising: first and second carriages (141) which are in use movably supported on respective ones of first and second guides (117); and first and second print head units (143, 145) which are mounted in adjacent, parallel relation to and between the carriages, wherein the print head units each comprise first and second print head actuators which are mounted on respective ones of the carriages, and a support member (151) which extends between the print head actuators, such as to be movable vertically thereby, and in use supports a printing element.

35 Claims, 6 Drawing Sheets

(56) References Cited

U.S. PATENT DOCUMENTS

| | | | | |
|---|---|---|---|---|
| 4,939,991 A | * | 7/1990 | Szarka | 101/115 |
| 4,949,636 A | * | 8/1990 | Tachibana | 101/123 |
| 5,176,076 A | * | 1/1993 | Azuma et al. | 101/123 |
| 5,476,039 A | * | 12/1995 | Hiruta et al. | 101/123 |

* cited by examiner

— Prior Art —

— Prior Art — ably supported on respective ones of first and second guides;
PRINT HEAD ASSEMBLY, SCREEN PRINTING SYSTEM AND METHOD This application is a national phase of International Application No. PCT/GB2009/000677 filed Mar. 13, 2009 and published in the English language.

BACKGROUND

The present invention relates to a print head assembly for printing a print medium, such as a fluid ink or a solder paste, onto workpieces, including flexible or delicate substrates, for example, as employed in solar or fuel cell applications, through a printing screen which includes a pattern of printing apertures corresponding to a pattern of deposits to be printed on a workpiece, a screen printing system incorporating the same, and a screen printing method.

Very many screen printing systems and print heads have been developed for the printing of print media onto workpieces.

FIGS. 1 and 2 illustrate a typical screen printing system which utilizes a print head in the form of a squeegee.

The screen printing system comprises a rigid support frame 3, which supports a printing screen 5, a pair of spaced, parallel linear bearings 7, 7 which are mounted to the support frame 3 at opposite sides of the printing screen 5, a print carriage 9 which includes a gantry 11 which is supported on the linear bearings 7, 7, and a print head assembly 15 which is mounted to the gantry 11 and operable to print a print medium through a pattern of printing apertures in the printing screen 5 onto a workpiece which is supported therebelow, and a drive unit 17, which comprises a drive motor 19 and a toothed drive belt 21 which is coupled to the print carriage 9, for reciprocatingly driving the print carriage 9 along the linear bearings 7, 7.

The print head assembly 15 comprises first and second squeegees 23, 25, which are juxtaposed in parallel relation and independently vertically movable in order to allow for configuration in dependence upon the direction of printing, and a drive mechanism 27 which couples the squeegees 23, 25 to the gantry 11 by a spring coupling (not illustrated) and is operable vertically to raise and lower the squeegees 23, 25 and maintain a downward force on the operative one of the squeegees 23, 25. The drive mechanism 27 comprises first and second actuators 31, 33, here stepper motors coupled by leadscrews, which are operable vertically to raise and lower respective ones of the squeegees 23, 25.

Operation of the print head assembly 15 is illustrated in FIGS. 2(a) and (b). As illustrated in FIG. 2(a), where printing is in a first direction D1 by the first squeegee 23, the first actuator 31 is operated to drive the first squeegee 23 downwardly into contact with the printing screen 5 and raise the drive mechanism 27 against the bias of the spring coupling, such that a predetermined downward biasing force is applied to the first squeegee 23, and the second actuator 33 is operated to drive the second squeegee 25 upwardly, such that the lower edge of the second squeegee 25 is raised clear of the face of the first squeegee 23 in order to allow for a clear space forwardly of the first squeegee 23 in the first direction of printing D1, which is necessary to allow for rolling of the print medium ahead of the first squeegee 23. Similarly, as illustrated in FIG. 2(b), where printing is in the other, second direction D2 by the second squeegee 25, the second actuator 33 is operated to drive the second squeegee 25 downwardly into contact with the printing screen 5 and raise the drive mechanism 27 against the bias of the spring coupling, such that a predetermined downward biasing force is applied to the second squeegee 25, and the first actuator 31 is operated to drive the first squeegee 23 upwardly, such that the lower edge of the first squeegee 23 is raised clear of the face of the second squeegee 25 in order to allow for a clear space forwardly of the second squeegee 25 in the second direction of printing D2, which is necessary to allow for rolling of the print medium ahead of the second squeegee 25.

This screen printing system has operated very successfully, but the present inventor has recognized that this screen printing system suffers from a number of drawbacks, particularly in relation to the printing of fluid inks onto flexible and delicate workpieces. In particular, the bulk of the gantry 11, which is necessary to confer the required rigidity, and the weight of the drive mechanism 27 which is mounted to gantry 11, limits the speed of movement of the print head assembly 15 and hence the machine throughput, and also induces vibrations at the start and end of each print stroke, which vibrations are particularly detrimental in relation to the printing of fluid inks onto flexible and delicate workpieces. In addition, the bulk of the gantry 11 restricts the view of the printing screen 5.

Enclosed print heads have also been developed. Examples include the applicant's earlier WO-A-1998/016387 and WO-A-2001/005592, where these screen printing heads are sold under the ProFlow® brand.

These enclosed print heads have operated very successfully to date, particularly in the printing of solder pastes onto printed circuit boards, but new applications, particularly in the production of solar and fuel cells, which utilize flexible and delicate substrates and require the printing of fluid inks, are presenting needs which cannot be met by these existing screen printing heads.

SUMMARY OF THE INVENTION

It is thus an aim of the present invention to provide an alternative print head assembly for printing a print medium onto workpieces, which at least in one embodiment allows for the printing of flexible and delicate workpieces and also allows for the printing of fluid print media, such as liquid inks.

In one aspect the present invention provides a print head assembly for printing a print medium onto a workpiece through a printing screen which includes a screen element having a pattern of printing apertures therein, the assembly comprising: first and second carriages which are in use movably supported on respective ones of first and second guides; and first and second print head units which are mounted in adjacent, parallel relation to and between the carriages, wherein the print head units each comprise first and second print head actuators which are mounted on respective ones of the carriages, and a support member which extends between the print head actuators, such as to be movable vertically thereby, and in use supports a printing element.

In one embodiment the guides comprise horizontal guides, preferably linear bearings.

In one embodiment the print head actuators of each print head unit are operable to provide for a controlled downward force to the respective support member, thereby enabling application of a controlled downward force to a printing element when attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head units each further comprise vertical guides, preferably linear bearings, which guide the respective support member vertically, such that substantially no horizontal force component is transmitted to the respective print head actuators.

In one embodiment the support member comprises a substantially U-shaped member.

In one embodiment the U-shaped support member defines a substantially clear opening when viewed laterally.

In one embodiment the support member includes first and second bracket elements which are coupled to respective ones of the respective first and second print head actuators and extend vertically adjacent respective inner sides of the print head actuators, and a horizontal bar element which extends between the opposite, lower ends of the bracket elements.

In one embodiment the print head units each comprise a stop adjustment mechanism, which provides for setting of upper and lower limits to vertical movement of the respective print head actuators.

In one embodiment the stop adjustment mechanism comprises first and second stop adjusters, preferably screw adjusters, at each end of the support member, with the first stop adjusters setting a lower limit to vertical movement of the respective print head actuators and the second stop adjusters setting an upper limit to vertical movement of the respective print head actuators.

In one embodiment the second stop adjusters can be disengaged to allow the respective support member to be raised well clear of the printing screen, thereby facilitating removal of the printing screen.

In one embodiment the support members of the print head units are disposed in spaced relation, such as to allow for introduction of print medium from above therebetween.

In one embodiment the support member of the first print head unit has a squeegee blade attached thereto and the support member of the second print head unit has a flood bar attached thereto, and the assembly is movable in oppositely-directed print and return strokes, such that, in the print stroke, the print head actuators of the first print head unit are controlled to bring the squeegee blade into operative contact with the screen element and apply a required downward force thereto for printing and the print head actuators of the second print head unit are controlled to raise the flood bar into an inoperative position, and, in the return stroke, the print head actuators of the first print head unit are controlled to raise the squeegee blade to an inoperative position and the print head actuators of the second print head unit are controlled to lower the flood bar to an operative position just clear of the screen element, such as to provide for application of a film of the print medium over the surface of the screen element.

In another embodiment the support members of the print head units each have a squeegee blade attached thereto, and the assembly is movable in first and second oppositely-directed print strokes, such that, in the first print stroke, the print head actuators of the first print head unit are controlled to bring the squeegee blade attached thereto into operative contact with the screen element and apply a required downward force thereto for printing and the print head actuators of the second print head unit are controlled to raise the squeegee blade attached thereto just clear of the screen element, and, in the second print stroke, the print head actuators of the first print head unit are controlled to raise the squeegee blade attached thereto to a position just clear of the screen element and the print head actuators of the second print head unit are controlled to lower the squeegee blade attached thereto into operative contact with the screen element and apply a required downward force thereto for printing.

In another aspect the present invention provides a screen printing system, comprising: a support frame which supports a printing screen and includes first and second guides; the above-described assembly which is supported on and between the guides, such as to be movable to print a print medium through the printing screen onto a workpiece which is supported therebelow; and a drive unit for driving the assembly along the guides in one of first and second, opposite directions.

In one embodiment the support frame has a rectangular shape in plan view and includes first and second frame support elements at each of the opposite sides thereof which receive and support the opposite sides of the printing screen.

In a further aspect the present invention provides a method of screen printing a print medium onto a workpiece through a printing screen which includes a screen element having a pattern of printing apertures therein, the method comprising the steps of: providing a print head assembly comprising: first and second carriages which are movably supported on respective ones of first and second guides; and first and second print head units which are mounted in adjacent, parallel relation to and between the carriages, wherein the print head units each comprise first and second print head actuators which are mounted on respective ones of the carriages, and a support member which extends between the print head actuators, such as to be movable vertically thereby; attaching printing elements, as one of a squeegee blade or a flood bar, to the support members of the print head units; and operating the assembly to print on a workpiece which is supported below the printing screen.

In one embodiment the guides comprise horizontal guides, preferably linear bearings.

In one embodiment the print head actuators of each print head unit are operable to provide for a controlled downward force to the respective support member, thereby enabling application of a controlled downward force to the printing element which is attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head units each further comprise vertical guides, preferably linear bearings, which guide the respective support member vertically, such that substantially no horizontal force component is transmitted to the respective print head actuators.

In one embodiment the support member comprises a substantially U-shaped member.

In one embodiment the U-shaped member defines a substantially clear opening when viewed laterally.

In one embodiment the support member includes first and second bracket elements which are coupled to respective ones of the respective first and second print head actuators and extend vertically adjacent respective inner sides of the print head actuators, and a horizontal bar element which extends between the opposite, lower ends of the bracket elements.

In one embodiment the print head units each comprise a stop adjustment mechanism, which provides for setting of upper and lower limits to vertical movement of the respective print head actuators.

In one embodiment the stop adjustment mechanism comprises first and second stop adjusters, preferably screw adjusters, at each end of the support member, and the method further comprises the step of: adjusting the first stop adjusters to set a lower limit to vertical movement of the respective print head actuators and the second stop adjusters to set an upper limit to vertical movement of the respective print head actuators.

In one embodiment the method further comprises the step of: dis-engaging the second stop adjusters to allow the respective support member to be raised well clear of the printing screen, thereby facilitating removal of the printing screen.

In one embodiment the support members of the print head units are disposed in spaced relation, and the method further comprises the step of: introducing print medium from above and between the support members.

In one embodiment the support member of the first print head unit has a squeegee blade attached thereto and the support member of the second print head unit has a flood bar attached thereto, and the print head assembly operating step comprises the steps of: controlling the print head actuators of the first print head unit to bring the squeegee blade into operative contact with the screen element and apply a required downward force thereto for printing; controlling the print head actuators of the second print head unit to raise the flood bar into an inoperative position; driving the assembly over the surface of the screen element in a first direction to print deposits of the print medium onto the workpiece which is supported below the printing screen; controlling the print head actuators of the first print head unit to raise the squeegee blade to an inoperative position; controlling the print head actuators of the second print head unit to lower the flood bar to an operative position just clear of the screen element; and driving the assembly over the surface of the screen element in a second, opposite direction to apply a film of the print medium over the surface of the screen element.

In another embodiment the support members of the first and second print head units each have a squeegee blade attached thereto which together define a cavity, and the print head assembly operating step comprises the steps of: controlling the print head actuators of the first print head unit to bring the squeegee blade attached thereto into operative contact with the screen element and apply a required downward force thereto for printing; controlling the print head actuators of the second print head unit to raise the squeegee blade attached thereto just clear of the screen element; driving the assembly over the surface of the screen element in a first direction to print deposits of the print medium onto the workpiece which is supported below the printing screen; controlling the print head actuators of the first print head unit to raise the squeegee blade attached thereto to a position just clear of the screen element; controlling the print head actuators of the second print head unit to lower the squeegee blade attached thereto into operative contact with the screen element and apply a required downward force thereto for printing; and driving the assembly over the surface of the screen element in a second, opposite direction to print deposits of the print medium onto the workpiece which is supported below the printing screen.

In one embodiment the method further comprises the step of: maintaining the cavity between the squeegee blades with a volume of print medium which is such that the print medium extends at least across the cavity in contact with each of the squeegee blades.

In another embodiment the method further comprises the step of: maintaining the cavity between the squeegee blades substantially full of print medium.

In one embodiment the print medium is a fluid material, preferably a liquid ink.

In another embodiment the print medium is a thick viscous material, preferably a solder paste.

In yet another aspect the present invention provides a print head assembly for printing a print medium onto a workpiece through a printing screen which includes a screen element having a pattern of printing apertures therein, the assembly comprising a print head unit mountable to and between first and second carriages, wherein the print head unit comprises first and second print head actuators which are mountable on respective ones of the carriages, and a support member which extends between the print head actuators, such as to be movable vertically thereby, and in use supports a printing element.

In one embodiment the guides comprise horizontal guides, preferably linear bearings.

In one embodiment the print head actuators are operable to provide for a controlled downward force to the support member, thereby enabling application of a controlled downward force to a printing element when attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head unit further comprises vertical guides, preferably linear bearings, which guide the support member vertically, such that substantially no horizontal force component is transmitted to the print head actuators.

In one embodiment the support member comprises a substantially U-shaped member.

In one embodiment the U-shaped support member defines a substantially clear opening when viewed laterally.

In one embodiment the support member includes first and second bracket elements which are coupled to respective ones of the print head actuators and extend vertically adjacent respective inner sides of the print head actuators, and a horizontal bar element which extends between the opposite, lower ends of the bracket elements.

In one embodiment the print head unit comprises a stop adjustment mechanism, which provides for setting of upper and lower limits to vertical movement of the print head actuators.

In one embodiment the stop adjustment mechanism comprises first and second stop adjusters, preferably screw adjusters, at each end of the support member, with the first stop adjusters setting a lower limit to vertical movement of the print head actuators and the second stop adjusters setting an limit to vertical movement of the print head actuators.

In one embodiment the second stop adjusters can be dis-engaged to allow the support member to be raised well clear of the printing screen, thereby facilitating removal of the printing screen.

In still another aspect the present invention provides a screen printing system, comprising: a support frame which supports a printing screen and includes first and second guides; the above-described assembly which is supported on and between the guides, such as to be movable to print a print medium through the printing screen onto a workpiece which is supported therebelow; and a drive unit for driving the assembly along the guides in one of first and second, opposite directions.

In one embodiment the support frame has a rectangular shape in plan view and includes first and second frame support elements at each of the opposite sides thereof which receive and support the opposite sides of the printing screen.

In still another aspect the present invention provides a method of screen printing a print medium onto a workpiece through a printing screen which includes a screen element having a pattern of printing apertures therein, the method comprising the steps of: providing a print head assembly comprising: first and second carriages which are movably supported on respective ones of first and second guides; and a print head unit which is mounted to and between the carriages, wherein the print head unit comprises first and second print head actuators which are mounted on respective ones of the carriages, and a support member which extends between the print head actuators, such as to be movable vertically thereby; attaching a printing element to the support member of the print head unit; and operating the assembly to print on a workpiece which is supported below the printing screen.

In one embodiment the guides comprise horizontal guides, preferably linear bearings.

In one embodiment the print head actuators are operable to provide for a controlled downward force to the support member, thereby enabling application of a controlled downward force to the printing element which is attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head unit further comprises vertical guides, preferably linear bearings, which guide the support member vertically, such that substantially no horizontal force component is transmitted to the print head actuators.

In one embodiment the support member comprises a substantially U-shaped member.

In one embodiment the U-shaped member defines a substantially clear opening when viewed laterally.

In one embodiment the support member includes first and second bracket elements which are coupled to respective ones of the respective first and second print head actuators and extend vertically adjacent respective inner sides of the print head actuators, and a horizontal bar element which extends between the opposite, lower ends of the bracket elements.

In one embodiment the print head unit comprises a stop adjustment mechanism, which provides for setting of upper and lower limits to vertical movement of the print head actuators.

In one embodiment the stop adjustment mechanism comprises first and second stop adjusters, preferably screw adjusters, at each end of the support member, and further comprising the step of: adjusting the first stop adjusters to set a lower limit to vertical movement of the print head actuators and the second stop adjusters to set an upper limit to vertical movement of the print head actuators.

In one embodiment the method further comprises the step of: dis-engaging the second stop adjusters to allow the support member to be raised well clear of the printing screen, thereby facilitating removal of the printing screen.

In still another aspect the present invention provides a print head assembly for printing a print medium onto a workpiece through a printing screen which includes a screen element having a pattern of printing apertures therein, the assembly comprising a print head unit mountable to and between first and second carriages, wherein the print head unit comprises a support member which extends between the carriages and in use supports a printing element, and the support member comprises a substantially U-shaped member.

In one embodiment the support member defines a substantially clear opening when viewed laterally.

In one embodiment the guides comprise horizontal guides, preferably linear bearings.

In one embodiment the print head unit further comprises first and second print head actuators which are mountable on respective ones of the carriages, and the support member extends between the print head actuators, such as to be movable vertically by the print head actuators.

In one embodiment the print head actuators are operable to provide for a controlled downward force to the support member, thereby enabling application of a controlled downward force to a printing element when attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head unit further comprises vertical guides, preferably linear bearings, which guide the support member vertically, such that substantially no horizontal force component is transmitted to the print head actuators.

In one embodiment the support member includes first and second bracket elements which are coupled to respective ones of the print head actuators and extend vertically adjacent respective inner sides of the print head actuators, and a horizontal bar element which extends between the opposite, lower ends of the bracket elements.

In one embodiment the print head unit further comprises a stop adjustment mechanism, which provides for setting of upper and lower limits to vertical movement of the print head actuators.

In one embodiment the stop adjustment mechanism comprises first and second stop adjusters, preferably screw adjusters, at each end of the support member, with the first stop adjusters setting a lower limit to vertical movement of the print head actuators and the second stop adjusters setting an upper limit to vertical movement of the print head actuators.

In one embodiment the second stop adjusters can be disengaged to allow the support member to be raised well clear of the printing screen, thereby facilitating removal of the printing screen.

In a still further aspect the present invention provides a screen printing system, comprising: a support frame which supports a printing screen and includes first and second guides; the above-described assembly which is supported on and between the guides, such as to be movable to print a print medium through the printing screen onto a workpiece which is supported therebelow; and a drive unit for driving the assembly along the guides in one of first and second, opposite directions.

In one embodiment the support frame has a rectangular shape in plan view and includes first and second frame support elements at each of the opposite sides thereof which receive and support the opposite sides of the printing screen.

In a yet still further aspect the present invention provides a screen printing system, comprising: a support frame which supports a printing screen and includes first and second guides at opposite sides thereof; and a print head assembly which is supported on and between the guides, such as to be movable to print a print medium through the printing screen onto a workpiece which is supported therebelow, the assembly comprising a print head unit mountable to and between first and second carriages, wherein the print head unit comprises a support member which includes a support element which extends between the carriages and in use supports a printing element, and, in an operative position, a substantial part of the support element is located below an upper surface of the support frame.

In one embodiment the support frame has a rectangular shape in plan view and includes first and second frame support elements at each of the opposite sides thereof which receive and support the opposite sides of the printing screen.

In one embodiment the system further comprises: a drive unit for driving the assembly along the guides in one of first and second, opposite directions.

In one embodiment the support member defines a substantially clear opening when viewed laterally.

In one embodiment the guides comprise horizontal guides, preferably linear bearings.

In one embodiment the print head unit further comprises first and second print head actuators which are mountable on respective ones of the carriages, and the support member extends between the print head actuators, such as to be movable vertically by the print head actuators.

In one embodiment the print head actuators are operable to provide for a controlled downward force to the support member, thereby enabling application of a controlled downward force to a printing element when attached to the support member.

In one embodiment the controlled downward force is in the range of from 0 to about 15 N, preferably with an accuracy of less than about 1%.

In one embodiment the print head actuators comprise low-friction actuators.

In one embodiment the print head actuators comprise low-friction pneumatic actuators.

In one embodiment the print head actuators each comprise a cylinder, a floating piston which is movably disposed within the cylinder and includes an attachment element which is attached to one end of the support member, and at least one fluid port to which a fluid pressure is applied to one of raise or lower the floating piston.

In one embodiment the print head unit further comprises vertical guides, preferably linear bearings, which guide the support member vertically, such that substantially no horizontal force component is transmitted to the print head actuators.

In one embodiment the support member includes first and second bracket elements which are coupled to respective ones of the print head actuators and extend vertically adjacent respective inner sides of the print head actuators, and the support element comprises a horizontal bar element which extends between the opposite, lower ends of the bracket elements.

In one embodiment the print head unit further comprises a stop adjustment mechanism, which provides for setting of upper and lower limits to vertical movement of the print head actuators.

In one embodiment the stop adjustment mechanism comprises first and second stop adjusters, preferably screw adjusters, at each end of the support member, with the first stop adjusters setting a lower limit to vertical movement of the print head actuators and the second stop adjusters setting an upper limit to vertical movement of the print head actuators.

In one embodiment the second stop adjusters can be disengaged to allow the support member to be raised well clear of the printing screen, thereby facilitating removal of the printing screen.

BRIEF DESCRIPTION OF THE DRAWINGS

Preferred embodiments of the present invention will now be described hereinbelow by way of example only with reference to the accompanying drawings, in which.

DETAILED DESCRIPTION

Figure 1:
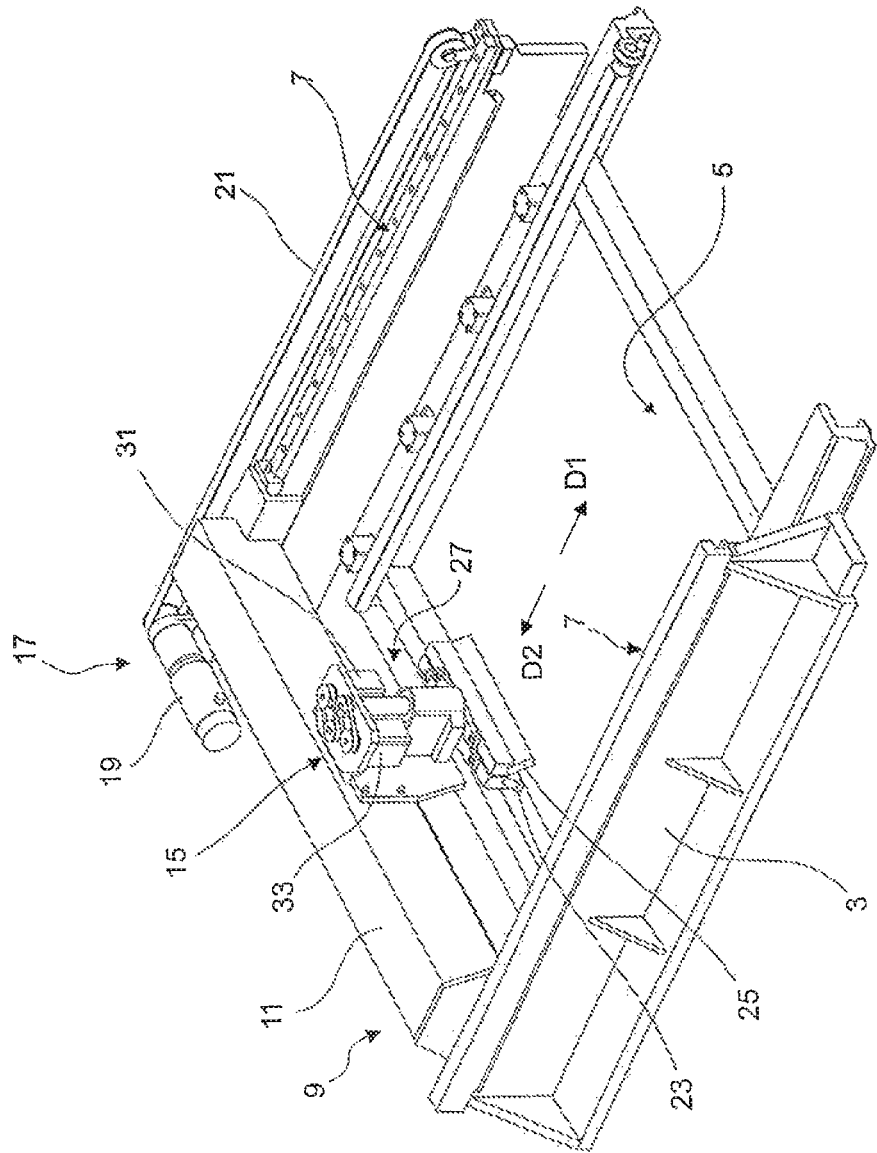
FIG. 1 illustrates a perspective view of a prior art screen printing system.
Figure 2A:
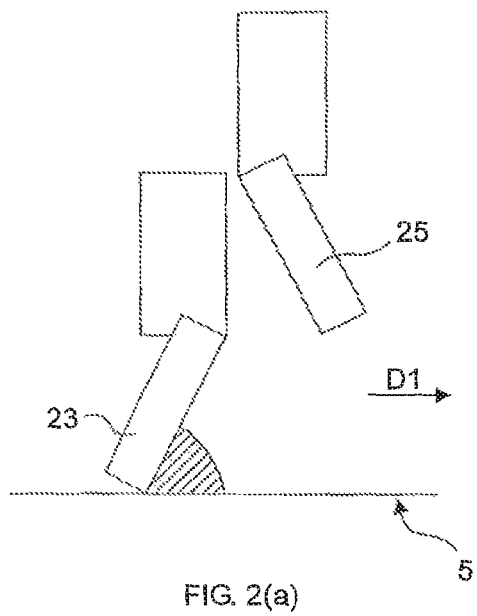
FIGS. 2(a) and (b) illustrate the operation of the print head assembly of the screen printing system of FIG. 1 in first and second opposite print strokes.
Figure 2B:
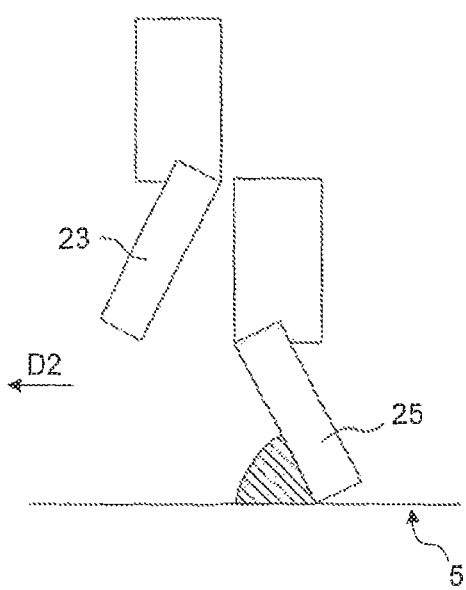
Figure 3:
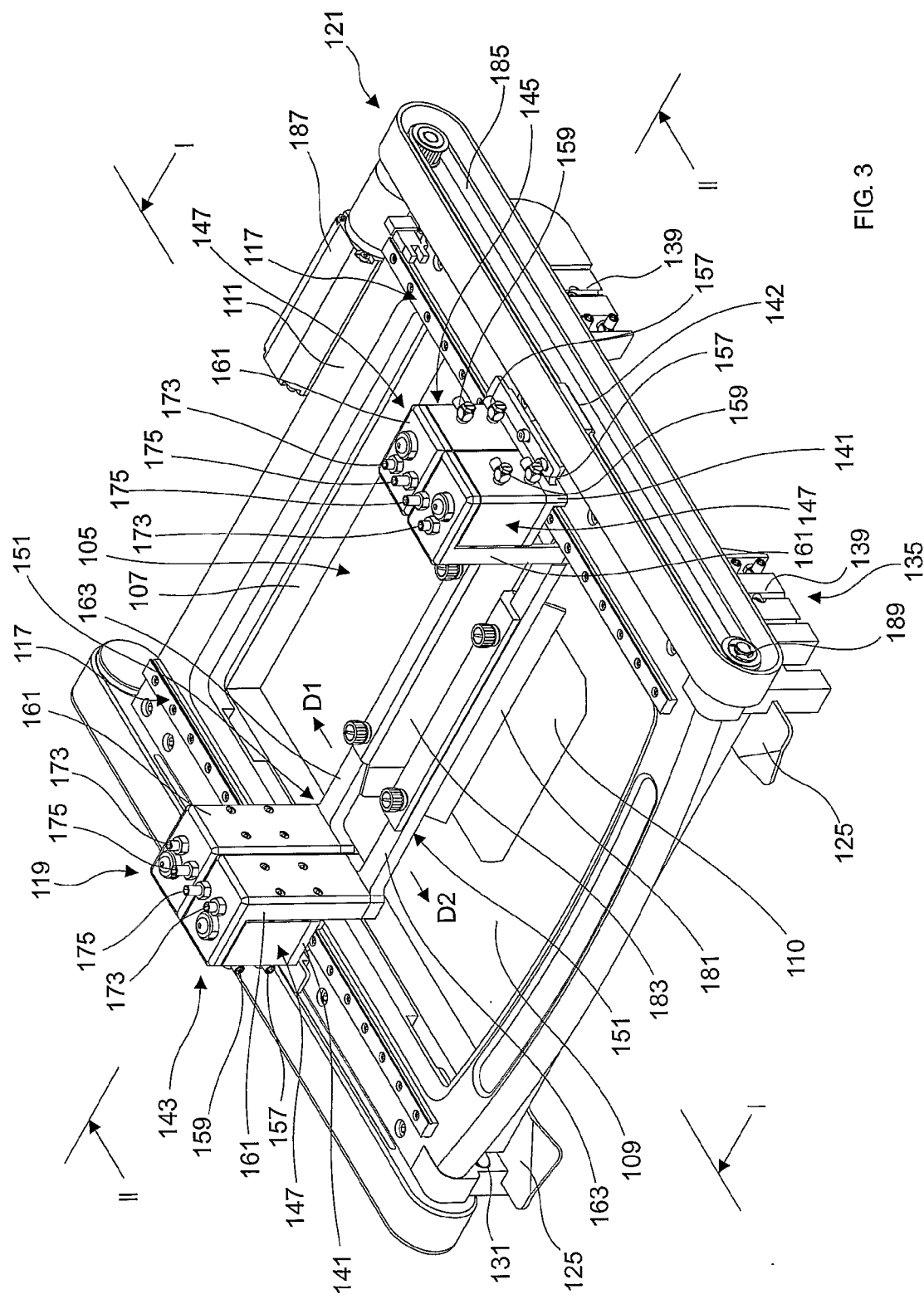
FIG. 3 illustrates a perspective view of a screen printing system in accordance with a preferred embodiment of the present invention.
Figure 4:
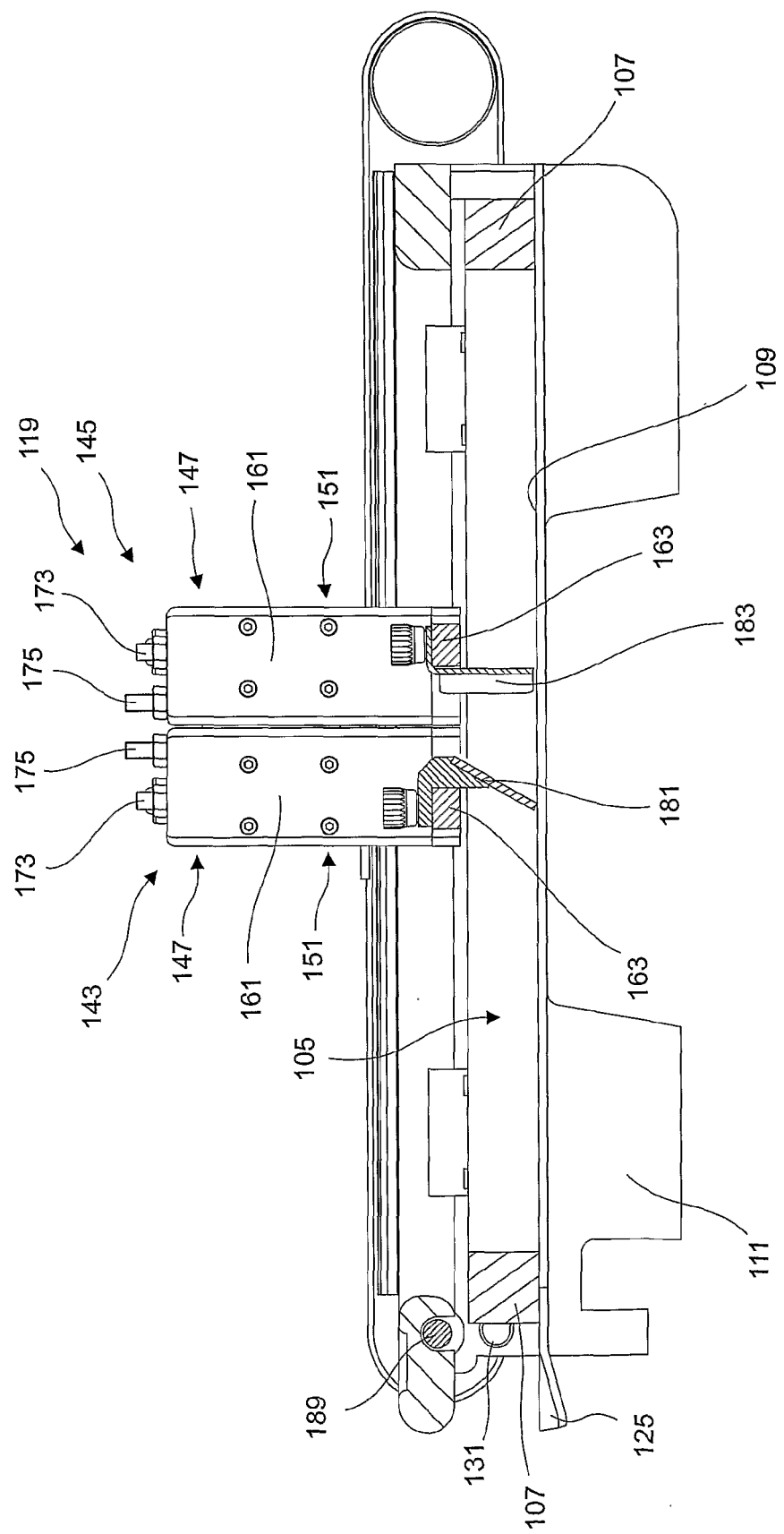
FIG. 4 illustrates a first vertical sectional view (along section I-I in FIG. 3) of the screen printing system of FIG. 3.

FIGS. 3 to 6 illustrate a screen printing system in accordance with a preferred embodiment of the present invention, which is configured to receive a printing screen 105 and print on workpieces through the printing screen 105.

In this embodiment the printing screen 105 comprises a frame 107, which has a rectangular shape in plan view, and a screen element 109, here in the form of a solid sheet, either formed of a metal or plastics material, or a coated mesh, which is mounted under tension to the frame 107 and includes a pattern of printing apertures 110, which defines a print area, through which a print medium is printed onto a workpiece supported therebelow.

The screen printing system comprises a rigid support frame 111 which supports the printing screen 105, first and second horizontal guides 117, 117 which are disposed in parallel relation on the support frame 111 at opposite sides of the printing screen 105, a print head assembly 119 which is supported on the horizontal guides 117, 117 such as to be movable in a horizontal plane and print a print medium through the printing screen 105 onto a workpiece which is supported therebelow, and a drive unit 121 for driving the print head assembly 119 along the horizontal guides 117, 117 in one of first and second, opposite directions D1, D2.

In this embodiment the support frame 111 has a rectangular shape in plan view and includes first and second frame support elements 125, 125, here ledges, at the opposite sides thereof, here at the lower edges, which receive and support the opposite sides of the frame 107 of the printing screen 105.

Figure 5:
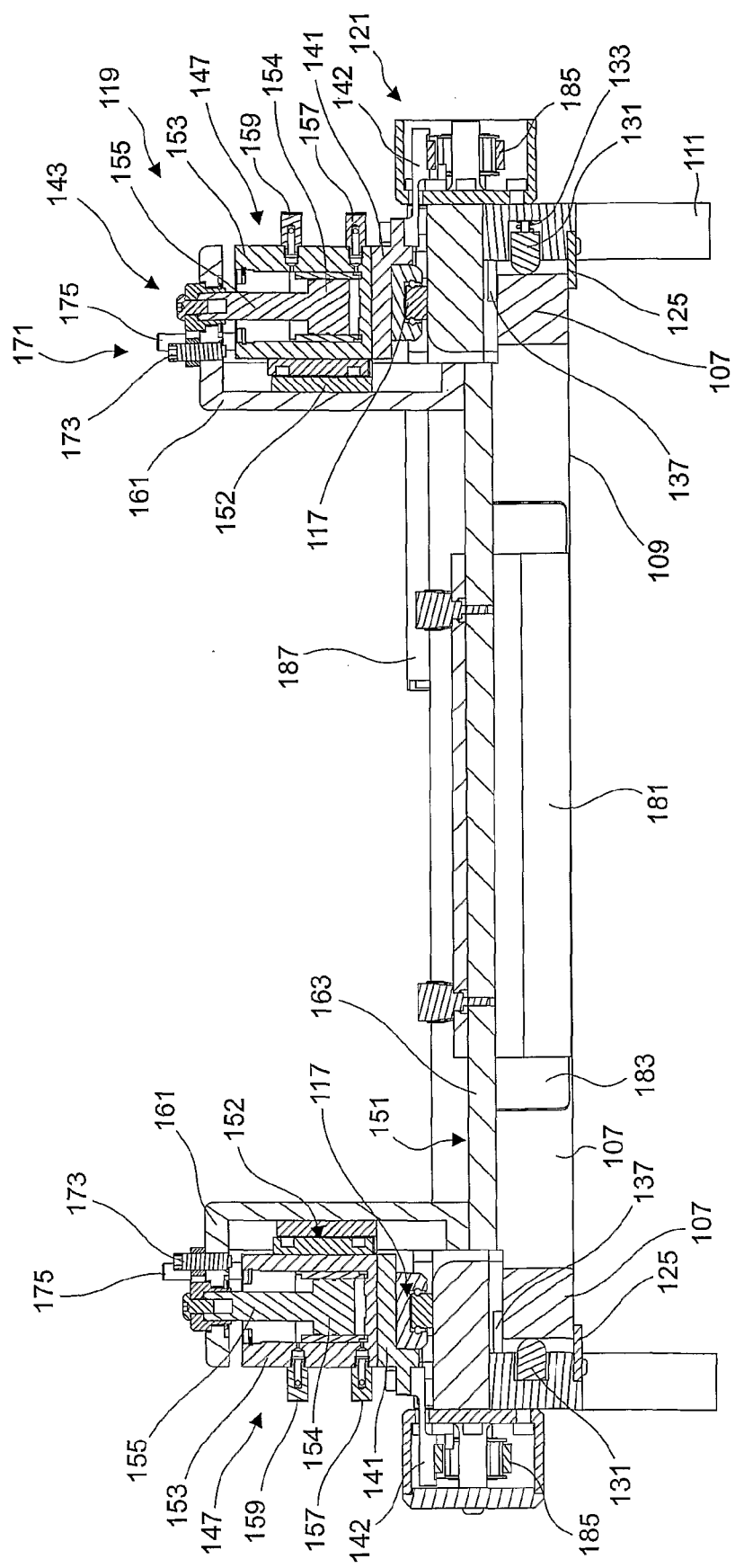
FIG. 5 illustrates a second vertical sectional view (along section II-II in FIG. 3) of the screen printing system of FIG. 3.

In this embodiment, as illustrated in FIG. 5, the opposite sides of the support frame 111 include inwardly-facing locating elements 131, which act to locate the printing screen 105 within the support frame 111. In this embodiment the locating elements 131 on one side of the support frame 111 are resiliently biased, here by spring elements 133, such as to bias the frame of the printing screen 105 against the locating elements 131 on the other side of the support frame 111.

In this embodiment the screen printing system further comprises a screen locking mechanism 135 for locking the printing screen 105 in a fixed position to the support frame 111.

In this embodiment, as illustrated in FIG. 5, the screen locking mechanism 135 comprises a plurality of clamp members 137 which are disposed in opposed relation to the frame support elements 125, 125 and operable to clamp the frame 107 of the printing screen 105 to the frame support elements 125, 125, and at least one, in this embodiment a plurality of actuators 139, here pneumatic actuators, for moving the clamp members 137 to clamp the printing screen 105 to the support frame 111.

In this embodiment the horizontal guides 117, 117 on the support frame 111 comprise linear bearings to which opposite ends of the print head assembly 119 are movably supported.

In this embodiment the print head assembly 119 comprises first and second carriages 141, 141, which are mounted on respective ones of the first and second horizontal guides 117, 117, and first and second print head units 143, 145, which are mounted in adjacent, parallel relation to and between the first and second carriages 141, 141.

In this embodiment the first and second carriages 141, 141 each include a coupling element 142, here including a toothed section, for engaging respective drive elements 185, 185 of the drive unit 121, as will be described in more detail hereinbelow.

The print head units 143, 145 each comprise first and second print head actuators 147, 147 which are mounted on respective ones of the first and second carriages 141, 141, a support member 151 which extends between the print head actuators 147, 147, such as to be movable vertically thereby, and supports a printing element, either as a squeegee blade 181 or a flood blade/bar 183, as will be described in more detail hereinbelow, and first and second vertical guides 152, 152, which guide the support member 151 in a vertical orient.

By supporting the print head actuators 147, 147 directly on the support frame 111, and not on a necessarily-bulky gantry as in the prior art, the support members 151, 151 of the first and second print head units 143, 145 can be of much reduced dimension, which reduces weight and also enables the support members 151, 151 to be located close to the printing screen 105 and not extend over a significant height, here having an upper height which is lower than the upper surface of the support frame 111, which improves line-of-sight visibility. In this embodiment the support members 151, 151 present a substantially open section between the support frame 111 when viewed horizontally.

In this embodiment the print head actuators 147, 147 comprise low-friction pneumatic actuators (Type MQQ TB 20-10D, as manufactured by SMC Pneumatics (UK), Milton Keynes, United Kingdom), which comprise a cylinder 153, a floating piston 154 which is movably disposed within the cylinder 153 and includes a rod guide 155 which extends vertically from the cylinder 153 and is moved by movement of the floating piston 154, and first and second fluid ports 157, 159 to which a fluid pressure, here a pneumatic pressure, as one of a positive pressure or a negative pressure (vacuum), is applied to one of raise or lower the floating piston 154 and the vertically-extending rod guide 155.

In this embodiment the respective ones of the first and second fluid ports 157, 159 of the print head actuators 147, 147 of the respective ones of the first and second print head units 143, 145 are commonly coupled, such that the print head actuators 147, 147 of the respective one of the first and second print head units 143, 145 are operated in unison.

In this embodiment the fluid supply is a pneumatic, compressed air supply which is switchably delivered to the first and second fluid ports 157, 159 of the print head actuators 147, 147 of the respective ones of the first and second print head units 143, 145 through a precision pressure regulator (Type ITV1050 as manufactured by SMC Pneumatics (UK), Milton Keynes, United Kingdom).

In this embodiment the first and second vertical guides 152, 152 comprise linear bearings to which opposite ends of the support member 151 are movably supported, such as to ensure that no horizontal force component is transmitted to the print head actuators 147, 147, which would otherwise act to provide a frictional resistance to the print head actuators 147, 147, which would impair the required precision pressure control from the print head actuators 147, 147.

In this embodiment the support member 151 comprises a substantially U-shaped member, which includes first and second bracket elements 161, 161 which are coupled to respective ones of the print head actuators 147, 147 and extend vertically adjacent the respective inner sides of the print head actuators 147, 147, and a horizontal bar element 163 which extends between the opposite, lower ends of the bracket elements 161, 161.

With this configuration, the U-shaped profile of the support members 151, 151 of the first and second print units 143, 145 provides an operator with much improved visibility of the surface of the printing screen 105, which is particularly advantageous in monitoring the state of the printing screen 105 and the print medium.

In this embodiment the first and second print head units 143, 145 each comprise a stop adjustment mechanism 171, which provides for setting of upper and lower limits to movement of the pistons 154, 154 of the print head actuators 147, 147.

In this embodiment the stop adjustment mechanism 171 comprises first and second screw adjusters 173, 175 at each end of the support member 151, with the first screw adjusters 173, 173 setting a lower limit to movement of the pistons 154, 154 of the print head actuators 147, 147 and the second screw adjusters 175, 175 setting an upper limit to movement of the pistons 154, 154 of the print head actuators 147, 147.

In one embodiment the print head actuators 147, 147 can be provided as longer stroke actuators, which, by dis-engaging the upper limit screw adjusters 175, 175, would allow the respective support member 151 and the printing element attached thereto to be raised well clear of the printing screen 105, thereby facilitating removal of the printing screen 105.

In this embodiment the support member 151 of the first print head unit 143 has a squeegee blade 181 attached thereto and the support member 151 of the second print head unit 145 has a flood bar 183 attached thereto.

With no pressure applied to the print head actuators 147, 147 of the first print head unit 143, the squeegee blade 181 will rest on the surface of the screen element 109 of the printing screen 105 and apply a force to the screen element 109 which is determined by the combined weight of the squeegee blade 181, the support member 151 and the floating piston 154 of each of the print head actuators 147, 147.

By applying a positive fluid pressure to the first fluid ports 157, 157 or a negative fluid pressure to the second fluid ports 159, 159 of the print head actuators 147, 147 of the first print head unit 143, the force applied by the squeegee blade 181 to the screen element 109 can be reduced, and, through the application of sufficient fluid pressure, the squeegee blade 181 can be lifted clear of the screen element 109, up to the upper limit set by the second screw adjusters 175, 175 of the stop adjustment mechanism 171.

Alternatively, by applying a negative fluid pressure to the first fluid ports 157, 157 or a positive fluid pressure to the second fluid ports 159, 159 of the print head actuators 147, 147 of the first print head unit 143, the force applied by the squeegee blade 181 to the screen element 109 can be increased.

Figure 6A:
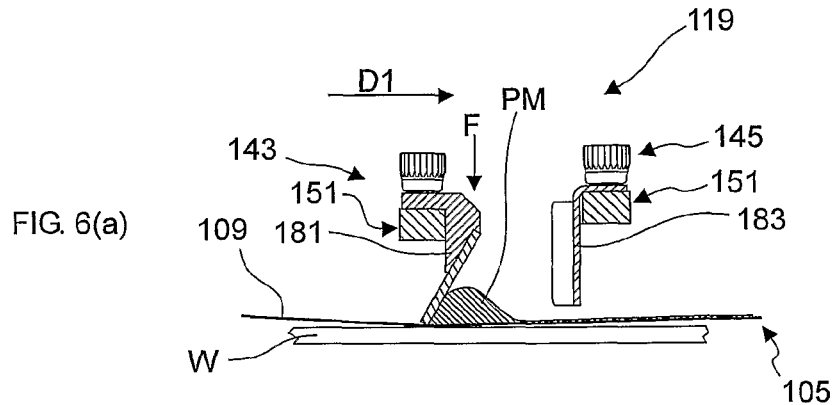
FIGS. 6(a) and (b) illustrate the operation of the print head assembly of the screen printing system of FIG. 3 in a first, print stroke and a second, return stroke, respectively.
Figure 6B:
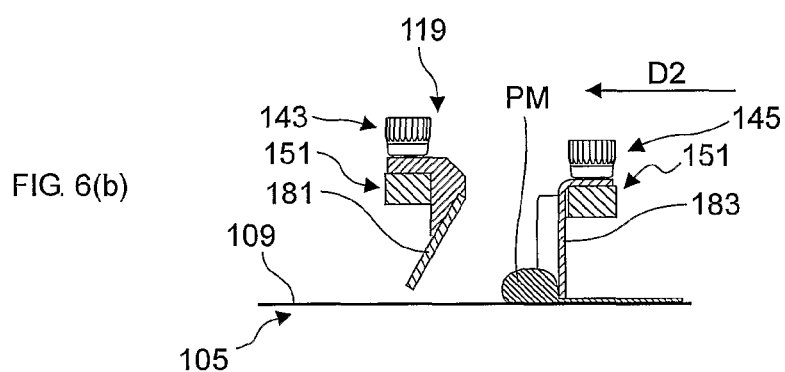

In this way, by controlled application of fluid pressure to respective ones of the first fluid ports 157, 157 or the second fluid ports 159, 159 of the print head actuators 147, 147 of the first print head unit 143, the squeegee blade 181 can apply any required downward force F to the screen element 109, in this embodiment in the range of from 0 to about 15 N, with an accuracy of about 1%, as illustrated in FIG. 6(a), or the squeegee blade 181 can be held clear of the screen element 109 in an inoperative position, as illustrated in FIG. 6(b).

In an alternative embodiment sufficient fluid pressure could be applied to the first fluid ports 157, 157 of the first print head unit 143 as to counteract the dead weight of the squeegee mechanism, and a controlled fluid pressure could be applied to the second fluid ports 159, 159 of the first print head unit 143 as to apply a required downward force to the squeegee blade 181.

With no pressure applied to the print head actuators 147, 147 of the second print head unit 145, the pistons 154, 154 of the print head actuators 147, 147 will be at the lower stop positions as defined by the first screw adjusters 173, 173 of the stop adjustment mechanism 171, such that the flood bar 183 is held just clear of the screen element 109 in a re-coating position, as illustrated in FIG. 6(b).

By applying a positive fluid pressure to the second fluid ports 159, 159 or a negative fluid pressure to the first fluid ports 157, 157 of the print head actuators 147, 147 of the second print head unit 145, the flood bar 183 is locked in the re-coating position. When using viscous liquid inks, the printing screen 105 commonly uses a coated mesh for the screen element 109 and it is desirable to maintain the image area of the screen element 109, as defined by the pattern of printing apertures 110, covered with a thin film of ink in order to prevent the ink from drying in the screen element 109 and blocking the pattern of printing apertures 110. By positioning the flood bar 183 in the re-coating position when returning the print head assembly 119 to the initial, starting position in each return stroke, the flood bar 183 acts to re-coat the surface of the screen element 109 with a thin film of the print medium, as illustrated in FIG. 6(b).

By applying a positive fluid pressure to the first fluid ports 157, 157 or a negative fluid pressure to the second fluid ports 159, 159 of the print head actuators 147, 147 of the second print head unit 145, the flood bar 183 can be raised further clear of the screen element 109, as defined by the upper limit set by the second screw adjusters 175, 175 of the stop adjustment mechanism 171, as illustrated in FIG. 6(a).

In this embodiment the drive unit 121 comprises first and second drive elements 185, 185, here toothed belts, which are attached to the coupling elements 142, 142 of respective ones of the first and second carriages 141, 141, and a drive motor 187 which is operable to drive the drive elements 185, 185 and hence the first and second carriages 141, 141. In this embodiment the drive elements 185, 185 are commonly coupled by a drive shaft 189, and the drive motor 187 is coupled to one drive element 185, such that operation of the drive motor 187 commonly drives the drive elements 185, 185 through the drive shaft 189.

Operation of the print head assembly 119 is illustrated in FIGS. 6(a) and (b).

In a print stroke, as illustrated in FIG. 6(a), in which the print head assembly 119 is moved in a first direction D1, the squeegee blade 181 of the first print head unit 143 is in contact with the screen element 109 and loaded with a required downward force F by the print head actuators 147, 147 of the first print head unit 143, such as to push the print medium PM forwardly of the face of the squeegee blade 181 and through the pattern of printing apertures 110 in the screen element 109 as deposits onto a workpiece W which is supported therebelow, and the flood bar 183 of the second print head unit 145 is held in the raised, inoperative position by the print head actuators 147, 147 of the second print head unit 145.

In a return stroke, as illustrated in FIG. 6(b), in which the print head assembly 119 is moved in a second direction D2, the squeegee blade 181 of the first print head unit 143 is raised out of contact with the screen element 109 and held in a raised, inoperative position by operation of the print head actuators 147, 147 of the first print head unit 143, and the flood bar 183 of the second print head unit 145 is lowered and held in the operative, re-coating position, such as to re-coat the surface of the screen element 109 with a thin film of the print medium PM.

Figure 7A:
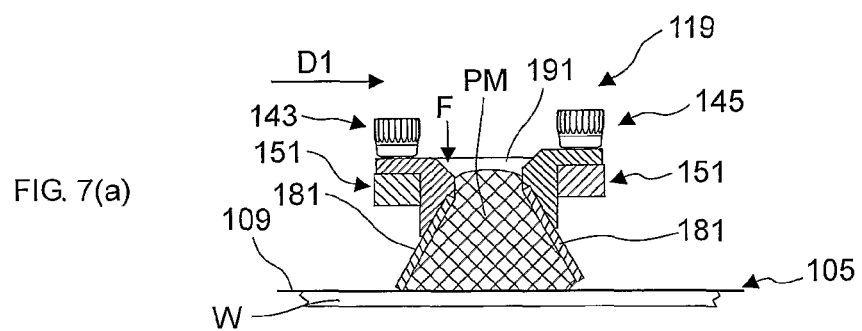
FIGS. 7(a) and (b) illustrate the operation of the print head assembly of an alternative embodiment of the screen printing system of FIG. 3 in first and second opposite print strokes, respectively.

In an alternative embodiment, as illustrated in FIGS. 7(a) and (b), which, for example, is for the printing of thick viscous materials, the support member 151 of the second print head unit 145 is fitted with a squeegee blade 181 in place of a flood bar 183, and the second print head unit 145 operated in the same manner as the first print head unit 143, as described hereinabove.

In this embodiment the upper ends of the squeegee blades 181, 181 are spaced apart sufficiently as to allow for the introduction of print medium PM into the cavity which is defined therebetween. In this way, the cavity between the squeegee blades 181, 181 can be maintained with a high fill volume of the print medium PM, and at least such that the print medium PM extends across the cavity in contact with each of the squeegee blades 181, 181. With this configuration, circulation of the print medium PM is achieved, which provides for a sufficient level of shear thinning as to enable printing at high print speeds, and higher print speeds than existing print heads.

In this embodiment the print head assembly 119 includes first and second end checks 191, 191, which are coupled to respective ends of the squeegee blades 181, 181, such as to retain the print medium PM between the squeegee blades 181, 181.

In this embodiment the end checks 191, 191 are fixed with fixing elements to the ends of the squeegee blades 181, 181, and each include slotted apertures, which extend in a vertical orient and allow for relative vertical movement of the squeegee blades 181, 181.

Figure 7B:
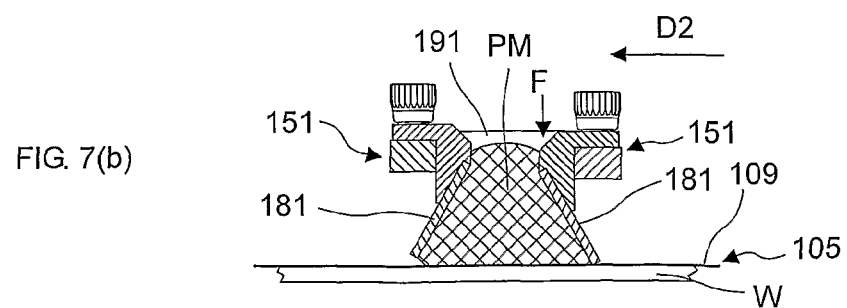

Operation of this alternative print head assembly 119 is illustrated in FIGS. 7(*a*) and (*b*). In this embodiment the print head assembly 119 is reciprocatingly movable in first and second print strokes in opposite directions D1, D2.

In a first, out print stroke, as illustrated in FIG. 7(*a*), in which the print head assembly 119 is moved in a first direction D1, the rear squeegee blade 181 of the first print head unit 143 is in contact with the screen element 109 and loaded with a required downward force F by the print head actuators 147, 147 of the first print head unit 143, such as to push the print medium PM forwardly of the face of the squeegee blade 181 and through the pattern of printing apertures 110 in the screen element 109 as deposits onto a workpiece W which is supported therebelow, and the forward squeegee blade 181 of the second print head unit 145 is held in a raised position just clear of the screen element 109 by the print head actuators 147, 147 of the second print head unit 145. The forward squeegee blade 181 of the second print head unit 145 is in close proximity to the screen element 109, but sufficiently spaced as to prevent contact with the screen element 109 during the out print stroke. In one embodiment the lower edge of the forward squeegee blade 181 is spaced by no more than about 1 mm from the screen element 109, and preferably by no more than about 0.5 mm. This configuration is in marked contrast to the prior art squeegee systems, in which the forward squeegee is maintained well clear of the rear, operative squeegee.

In a second, return print stroke, as illustrated in FIG. 7(*b*), in which the print head assembly 119 is moved in a second, opposite direction D2, the rear squeegee blade 181 of the second print head unit 145 is in contact with the screen element 109 and loaded with a required downward force F by the print head actuators 147, 147 of the second print head unit 145, such as to push the print medium PM forwardly of the face of the squeegee blade 181 and through the pattern of printing apertures 110 in the screen element 109 as deposits onto a workpiece W which is supported therebelow, and the forward squeegee blade 181 of the first print head unit 143 is held in a raised position just clear of the screen element 109 by the print head actuators 147, 147 of the first print head unit 143. Similarly to the configuration for the first, out print stroke, the forward squeegee blade 181 of the first print head unit 143 is in close proximity to the screen element 109, but sufficiently spaced as to prevent contact with the screen element 109 during the return print stroke. In one embodiment the lower edge of the forward squeegee blade 181 is spaced by no more than about 1 mm from the screen element 109, and preferably by no more than about 0.5 mm.

The present inventor has established surprisingly that this configuration of the squeegee blades 181, 181, in which the forward squeegee blade 181 in the direction of movement is raised just clear of the screen element 109, in combination with the provision of a volume of print medium PM in the cavity between the squeegee blades 181, 181 which substantially fills the cavity, provides for a performance at least equivalent to the existing enclosed screen printing heads.

Finally, it will be understood that the present invention has been described in its preferred embodiments and can be modified in many different ways without departing from the scope of the invention as defined by the appended claims.

What is claimed is:

1. A print head assembly for printing a print medium onto a workpiece through a printing screen which includes a screen element having a pattern of printing apertures therein, the assembly comprising:

first and second carriages which are in use movably supported on respective ones of first and second guides; and first and second print head units which are mounted in adjacent, parallel relation to and between the carriages, wherein the print head units each comprise first and second print head actuators which are mounted on respective ones of the carriages, and a support member which extends between the print head actuators to be movable vertically thereby;

wherein the support members of the print head units each have a squeegee blade attached thereto, and the assembly is movable in first and second oppositely-directed print strokes, such that, in the first print stroke, the print head actuators of the first print head unit are controlled to bring the squeegee blade attached thereto into operative contact with the screen element and apply a required downward force thereto for printing and the print head actuators of the second print head unit are controlled to raise the squeegee blade attached thereto just clear of the screen element, and, in the second print stroke, the print head actuators of the first print head unit are controlled to raise the squeegee blade attached thereto to a position just clear of the screen element and the print head actuators of the second print head unit are controlled to lower the squeegee blade attached thereto into operative contact with the screen element and apply a required downward force thereto for printing;

wherein a cavity between the squeegee blades is maintained with a volume of print medium which is such that the print medium extends across the cavity and in contact with each of the squeegee blades in each of the first and second print strokes.

2. The assembly of claim 1, wherein the guides comprise horizontal guides or linear bearings.

3. The assembly of claim 1, wherein the print head actuators of each print head unit are operable to provide for a controlled downward force to the respective support member, thereby enabling application of a controlled downward force to the squeegee blade when attached to the support member.

4. The assembly of claim 3, wherein the controlled downward force is in the range of from 0 to about 15 N and with an accuracy of less than about 1%.

5. The assembly of claim 3, wherein the print head actuators comprise low-friction actuators or low-friction pneumatic actuators.

6. The assembly of claim 3, wherein the print head actuators each comprise a cylinder, a floating piston which is movably disposed within the cylinder and includes an attachment element which is attached to one end of the support member, and at least one fluid port to which a fluid pressure is applied to one of raise or lower the floating piston.

7. The assembly of claim 1, wherein the print head units each further comprise vertical guides or linear bearings, which guide the respective support member vertically, such that substantially no horizontal force component is transmitted to the respective print head actuators.

8. The assembly of claim 1, wherein the support member comprises a substantially U-shaped member.

9. The assembly of claim 8, wherein the U-shaped support member defines a substantially clear opening when viewed laterally.

10. The assembly of claim 8, wherein the support member includes first and second bracket elements which are coupled to respective ones of the respective first and second print head actuators and extend vertically adjacent respective inner sides of the print head actuators, and a horizontal bar element which extends between the opposite, lower ends of the bracket elements.

11. The assembly of claim 1, wherein the print head units each comprise a stop adjustment mechanism, which provides for setting of upper and lower limits to vertical movement of the respective print head actuators.

12. The assembly of claim 11, wherein the stop adjustment mechanism comprises first and second stop adjusters or screw adjusters, at each end of the support member, with the first stop adjusters or screw adjusters setting a lower limit to vertical movement of the respective print head actuators and the second stop adjusters or screw adjusters setting an upper limit to vertical movement of the respective print head actuators.

13. The assembly of claim 12, wherein the second stop adjusters or screw adjusters can be dis-engaged to allow the respective support member to be raised well clear of the printing screen, thereby facilitating removal of the printing screen.

14. The assembly of claim 1, wherein the support members of the print head units are disposed in spaced relation to allow for introduction of print medium from above therebetween.

15. The system of claim 1, wherein the cavity between the squeegee blades is maintained substantially full of print medium.

16. The system of claim 1, wherein the print medium is a fluid material or a liquid ink.

17. The system of claim 1, wherein the print medium is a thick viscous material or a solder paste.

18. A screen printing system, comprising:
a support frame which supports a printing screen and includes first and second guides;
the assembly of claim 1 which is supported on and between the guides to be movable to print a print medium through the printing screen onto a workpiece which is supported therebelow; and
a drive unit for driving the assembly along the guides in one of first and second, opposite directions.

19. A method of screen printing a print medium onto a workpiece through a printing screen which includes a screen element having a pattern of printing apertures therein, the method comprising the steps of:
providing a print head assembly comprising: first and second carriages which are movably supported on respective ones of first and second guides; and first and second print head units which are mounted in adjacent, parallel relation to and between the carriages, wherein the print head units each comprise first and second print head actuators which are mounted on respective ones of the carriages, and a support member which extends between the print head actuators to be movable vertically thereby;
attaching a squeegee blade to each of the support members of the print head units;
operating the assembly to print on a workpiece which is supported below the printing screen, wherein the print head assembly operating step comprises the steps of:
controlling the print head actuators of the first print head unit to bring the squeegee blade attached thereto into operative contact with the screen element and apply a required downward force thereto for printing;
controlling the print head actuators of the second print head unit to raise the squeegee blade attached thereto just clear of the screen element;
driving the assembly over the surface of the screen element in a first direction to print deposits of the print medium onto the workpiece which is supported below the printing screen;
controlling the print head actuators of the first print head unit to raise the squeegee blade attached thereto to a position just clear of the screen element;
controlling the print head actuators of the second print head unit to lower the squeegee blade attached thereto into operative contact with the screen element and apply a required downward force thereto for printing;
driving the assembly over the surface of the screen element in a second, opposite direction to print deposits of the print medium onto the workpiece which is supported below the printing screen; and
maintaining a cavity between the squeegee blades with a volume of print medium which is such that the print medium extends across the cavity and in contact with each of the squeegee blades in each of the first and second print strokes.

20. The method of claim 19, wherein the guides comprise horizontal guides or linear bearings.

21. The method of claim 19, wherein the print head actuators of each print head unit are operable to provide for a controlled downward force to the respective support member, thereby enabling application of a controlled downward force to the squeegee blade which is attached to the support member.

22. The method of claim 21, wherein the controlled downward force is in the range of from 0 to about 15 N and with an accuracy of less than about 1%.

23. The method of claim 19, wherein the print head actuators comprise low-friction actuators or low-friction pneumatic actuators.

24. The method of claim 19, wherein the print head actuators each comprise a cylinder, a floating piston which is movably disposed within the cylinder and includes an attachment element which is attached to one end of the support member, and at least one fluid port to which a fluid pressure is applied to one of raise or lower the floating piston.

25. The method of claim 19, wherein the print head units each further comprise vertical guides or linear bearings, which guide the respective support member vertically, such that substantially no horizontal force component is transmitted to the respective print head actuators.

26. The method of claim 19, wherein the support member comprises a substantially U-shaped member.

27. The method of claim 26, wherein the U-shaped member defines a substantially clear opening when viewed laterally.

28. The method of claim 26, wherein the support member includes first and second bracket elements which are coupled to respective ones of the respective first and second print head actuators and extend vertically adjacent respective inner sides of the print head actuators, and a horizontal bar element which extends between the opposite, lower ends of the bracket elements.

29. The method of claim 19, wherein the print head units each comprise a stop adjustment mechanism, which provides for setting of upper and lower limits to vertical movement of the respective print head actuators.

30. The method of claim 29, wherein the stop adjustment mechanism comprises first and second stop adjusters or screw adjusters, at each end of the support member, and further comprising the step of:

adjusting the first stop adjusters or screw adjusters to set a lower limit to vertical movement of the respective print head actuators and the second stop adjusters or screw adjusters to set an upper limit to vertical movement of the respective print head actuators.

31. The method of claim 30, further comprising the step of:
dis-engaging the second stop adjusters or screw adjusters to allow the respective support member to be raised well clear of the printing screen, thereby facilitating removal of the printing screen.

32. The method of claim 19, wherein the support members of the print head units are disposed in spaced relation, and further comprising the step of:
introducing print medium from above and between the support members.

33. The method of claim 19, further comprising the step of:
maintaining the cavity between the squeegee blades substantially full of print medium.

34. The method of claim 19, wherein the print medium is a fluid material or a liquid ink.

35. The method of claim 19, wherein the print medium is a thick viscous material or a solder paste.

* * * * *